United States Patent [19]

Rogers

[11] Patent Number: 5,032,743
[45] Date of Patent: Jul. 16, 1991

[54] SKEW CLAMP

[75] Inventor: Alan C. Rogers, South Portland, Me.

[73] Assignee: National Semiconductor Corporation, Santa Clara, Calif.

[21] Appl. No.: 521,215

[22] Filed: May 9, 1990

[51] Int. Cl.⁵ ............................................. H03K 5/12
[52] U.S. Cl. ................................... 307/443; 307/263; 307/269; 371/1
[58] Field of Search .............. 307/480, 481, 443, 450, 307/451, 452, 453, 263, 268, 269, 355; 371/1, 63

[56] References Cited

U.S. PATENT DOCUMENTS

| 4,250,410 | 2/1981 | Moench et al. | 307/263 |
| 4,645,947 | 2/1987 | Prak | 307/269 |
| 4,661,721 | 4/1987 | Ushiku | 307/480 |
| 4,689,496 | 8/1987 | Kerber et al. | 307/269 |
| 4,700,346 | 10/1987 | Chandran et al. | 371/1 |
| 4,737,971 | 4/1988 | Lanzafame | 371/1 |
| 4,871,931 | 10/1989 | Fitzpatrick et al. | 307/443 |

Primary Examiner—David Hudspeth
Assistant Examiner—Andrew Sanders
Attorney, Agent, or Firm—Gail W. Woodward; Lee Patch; Michael A. Glenn

[57] ABSTRACT

A circuit is described for reducing the skew between a pair of signal lines in a digital system. Before the two lines display a change in signal the circuit senses whether the signals are similar or different. If similar, the two lines are clamped together in true fashion. If different, the two lines are clamped together complementarily such that the signals remain mutually inverted.

9 Claims, 2 Drawing Sheets

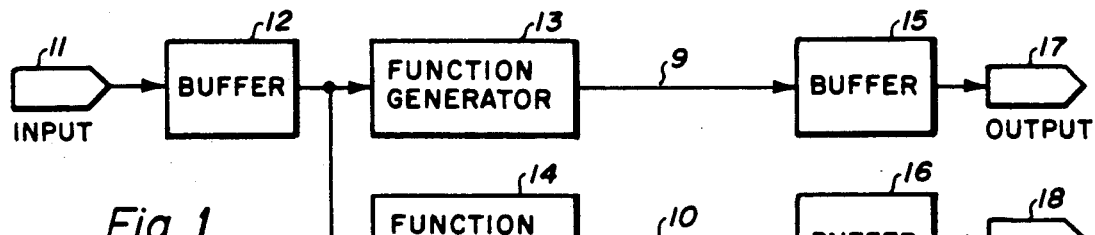
Fig_1 (PRIOR ART)
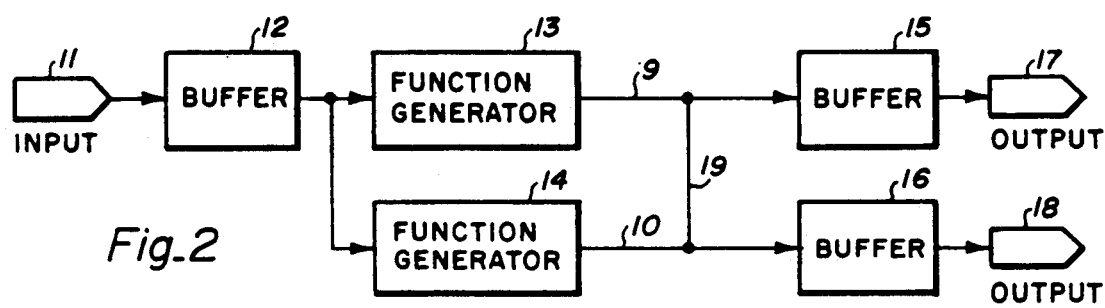
Fig_2
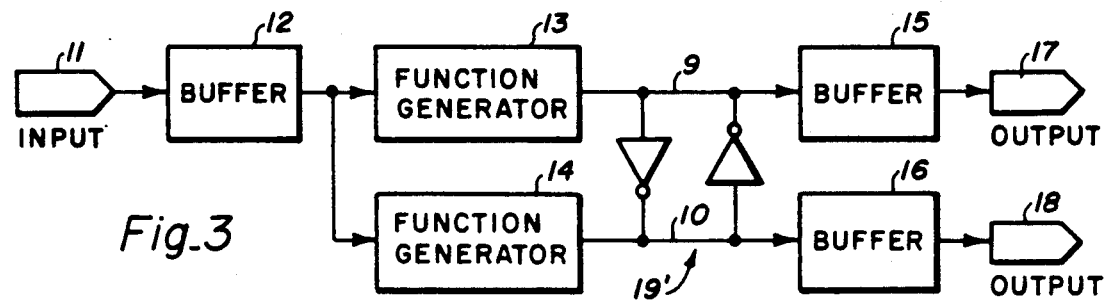
Fig_3
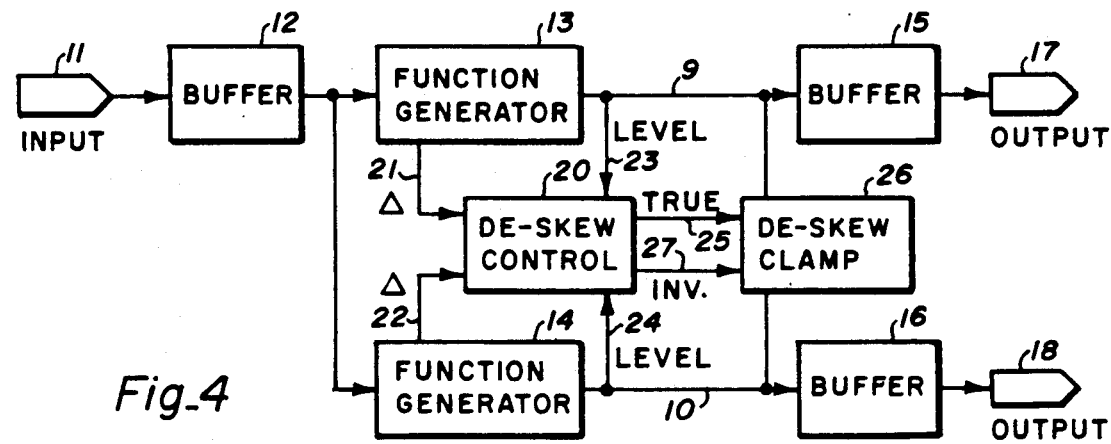
Fig_4

1

SKEW CLAMP

BACKGROUND OF THE INVENTION

In digital electronic systems it is often important that two signals appear with a minimum of delay between them. For example, if the clock and clock or a clock-1 and clock-2 signals, are not close enough together, a system may malfunction. Even if the two clock signals are not far enough apart to cause malfunction, the skew between them might still consume valuable cycle time. Ordinarily, skew is reduced to a minimum, as much as possible, by good design and the system speed is then compromized to the degree that the maximum skew is tolerated. Since design inaccuracy, manufacturing spreads and operating spreads are all present, uncontrolled skew can still be a problem.

SUMMARY OF THE INVENTION

It is an object of the invention to reduce the skew which would otherwise be present between the signals on two lines in a digital system.

It is a further object of the invention to sense the signals present on two lines and to clamp the two lines together in either the same, or the inverted states, or not at all, depending upon the function present.

It is a still further object of the invention to compare the two levels on two system lines and to sense the changes in the two signals, then, if there is a change present and the levels the same, the two lines are clamped together and if there is a change present and the levels are different, the two lines are clamped together in an inverse relationship.

These and other objects are achieved in the following manner. Two lines in a digital system are provided with drivers and/or isolation buffers. A transmission gate is coupled between the two lines so that when it is turned on, the lines are clamped together and the signals are true. A latch is also coupled between the two lines so that when turned on, will operate the two lines inverted in phase opposition, or complementarily. Thus, under either signal condition skew is substantially eliminated. A sensor circuit monitors the signal condition on the two lines. When the signal on both of the two lines is to change the sensor determines whether the levels are the same or different. If the levels are the same, the transmission gate is actuated thus clamping the lines together. If the two levels are different, the latch is turned on thus clamping the two lines in inverted complementary fashion.

BRIEF DESCRIPTION OF THE DRAWING

FIG. 1 is a block diagram showing a prior art two line digital transmission system.

FIG. 2 is a block diagram of a simplified version of the invention.

FIG. 3 is a block diagram of an alternative embodiment of a simplified form of the invention.

FIG. 4 is a detailed block diagram of the invention.

DESCRIPTION OF THE INVENTION

Figure 5:
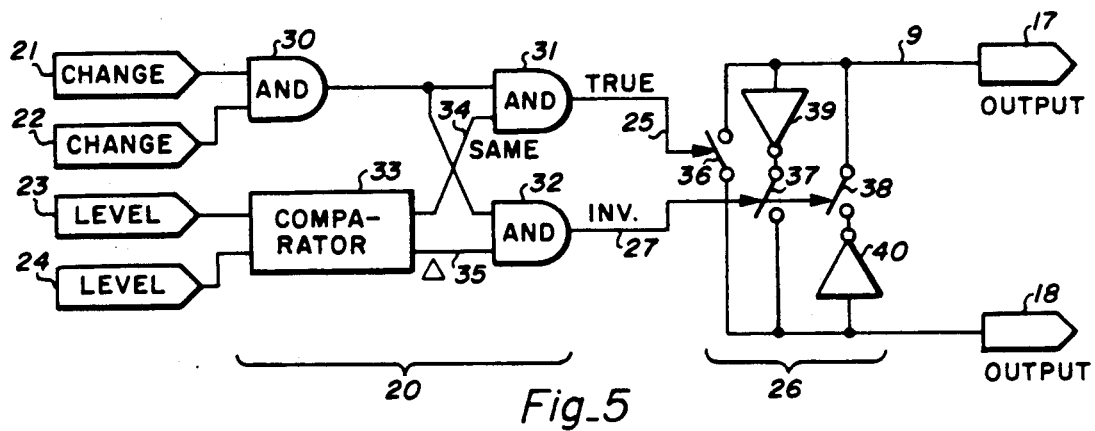
FIG. 5 is a detailed block diagram of the deskew control and clamp blocks of FIG. 4.

As shown in FIG. 1, lines 9 and 10 represent prior art digital lines. While transmission or clock lines are shown, it is to be understood that any two points in a digital circuit could be contemplated. Input terminal 11 drives an optional buffer 12 which in turn drives a pair of function generators 13 and 14 whose outputs respectively drive lines 9 and 10. Optional buffers 15 and 16 act to isolate outputs 17 and 18 which typically will be the clock lines in a computer or microprocessor. Skew beteen the clock line signals can produce problems in the system design and operation. It is to be understood that the various elements shown in the drawing are conventional and well-known to persons of ordinary skill in the digital arts. These components shown can be of any form. While complementary metal oxide semiconductor (CMOS) circuitry is preferred, other forms, such as $T^2L$, $I^2L$ or ECL, can be employed.

FIG. 2 is a block diagram in which function generators 13 and 14 produce the same (or true) signals. Element 19 connects lines 9 and 10 together thus eliminating skew between the output signals. This is regarded as a trivial skew removal system.

FIG. 3 is a block diagram in which the two function generators 13 and 14' are different. Function generator 14' produces a complementary output with respect to that of function generator 13. Thus, lines 9 and 10 carry complementary signals. Skew eliminator 19' is a simple latch which ensures that lines 9 and 10 are complementary.

In FIG. 4 a universal deskew system is shown. Where the elements are similar to those of FIG. 1 they carry the same designations. A de-skew control 20 is connected via lines 21 and 22 to predict a change in the digital signals. It is further connected via lines 23 and 24 to sense the level of the signals that are to change on lines 9 and 10. If a change is to occur and the levels are equal, the de-skew control 20 via line 25 tells a clamp circuit 26 to lock lines 9 and 10 together in true fashion. If the levels are unequal, de-skew control 20 tells clamp circuit 26, via line 27, to lock lines 9 and 10 together in inverted or complementary fashion. If only one of the lines is to change then the lines will not be clamped.

As shown in FIG. 5, de-skew control 20 can consist of three AND gates and a comparator. AND gate 30 receives its inputs from lines 21 and 22 with its output driving one input each of AND gates 31 and 32. Comparator 33 receives its inputs from lines 23 and 24. When AND gate 30 senses that both signals are to change and comparator 33 indicates equal signal levels. AND gate 31 will be activated via line 34. However, when the signals on lines 23 and 24 are different, comparator 33 will actuate AND gate 32 via line 35.

When AND gate 31 is actuated it will turn switch 36 in clamp circuit 26, on by way of line 25. For this state, switch 36 will lock lines 9 and 10 together in true fashion thereby eliminating skew.

When AND gate 32 is actuated it will turn switches 37 and 38 on. This will connect inverters 39 and 40 into a latching configuration so that they will lock lines 9 and 10 into an inverted state. Thus, the skew of lines 9 and 10 will be eliminated for the complementary signals.

Figure 6:
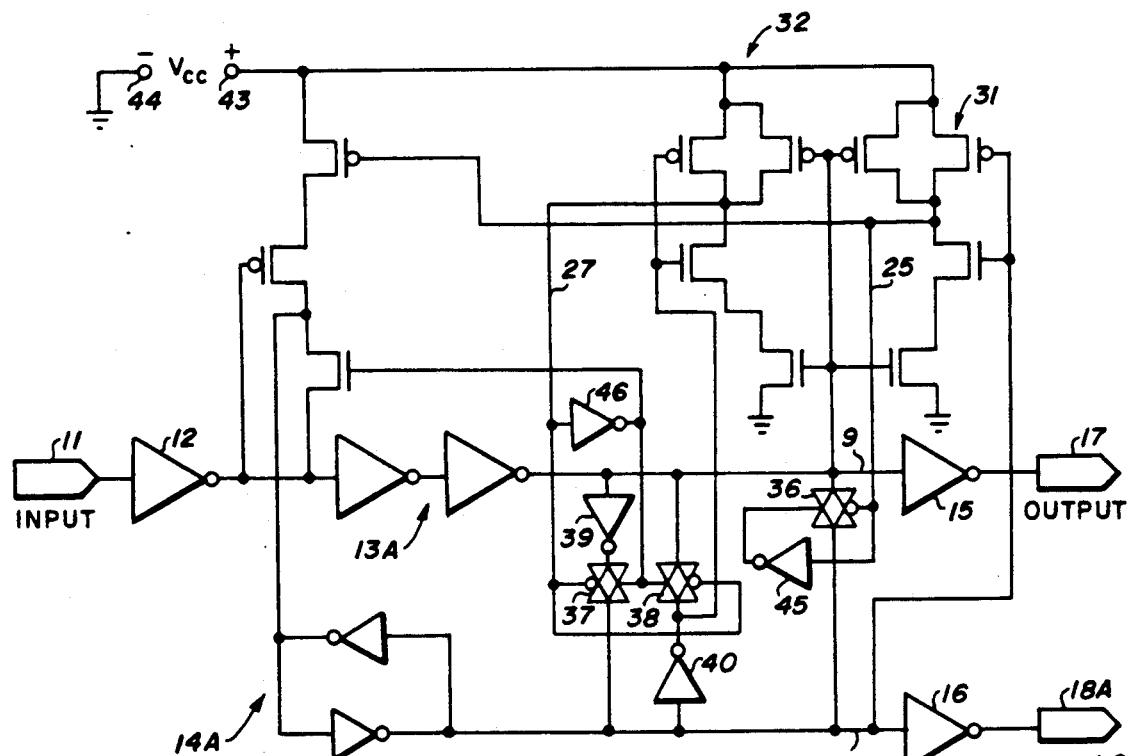
FIG. 6 is a schematic-block diagram of a skew clamp in accordance with the invention, showing a two line system operating at true and divide by two states.

FIG. 6 is a schematic-block diagram of another embodiment of the invention. A logic input at 11 drives two lines 9 and 10 via buffer inverter 12 and buffer 13A to produce a pair of outputs, one being a true version of the input and the other being a divide by two output. The circuit operates from a $V_{CC}$ power supply connected + to terminal 43 and − to ground terminal 44.

Where the elements are the same as those of FIGS. 4 and 5, the same numerals are used.

Function generator 13A is composed of a pair of inverters that produce a signal delay approximating that of function generator 14A which is composed of a latch and driver elements that result in a two-to-one signal frequency division. AND gate 31 has an output line 25 that operates switch 36 which is shown as a transmission gate. Switch 36 has its P channel transistor input driven directly from line 25 and inverter 45 drives the N channel element. Thus, when line 25 is low switch 36 will be on thereby connecting lines 9 and 10 together. AND gate 31 receives direct inputs from lines 9 and 10 as shown.

Switches 37 and 38 are each transmission gates which, when turned on, connect inverters 39 nd 40 to form a latch that joins lines 9 and 10 complementarily. Switches 37 and 38 have their P channel elements directly driven from line 27 and inverter 46 drives the N channel elements. When line 27 is high, switches 37 and 38 will both be on and lines 9 and 10 forced into a complementary relationship. One important consideration is that inverter 40 drives the left hand input of AND gate 32 to provide the comparator 33 function.

The invention has been described and embodiments shown to enable a person skilled in the art to practice the same. When such a person reads the foregoing description, alternatives and equivalents, that are within the spirit and intent of the invention, will be apparent. For example, while the preferred embodiment is shown using CMOS construction, other circuit configurations can be employed. Accordingly, it is intended that the scope of invention of limited only by the following claims.

I claim:

1. A circuit for reducing the skew between digital signals which appear on a pair of lines in a digital system, said circuit comprising:

means for determining whether said digital signals are true or complementary to each other; and means for coupling said pair of lines together in true fashion when said signals are determined to have a true relationship.

2. A circuit for reducing the skew between digital signals which appear on a pair of lines in a digital system, said circuit comprising:

means for determining whether said digital signals are true or complementary to each other; and means for coupling said pair of lines together in complementary fashion when said signals are determined to have a complementary relationship.

3. A circuit for reducing the skew between digital signals which appear on a pair of lines in a digital system, said circuit comprising:

first means coupled between said pair of lines for forcing said digital signals to the same potential in response to a true stimulus;

second means coupled between said pair of lines for forcing said digital signals to complementary potentials in response to a complementary stimulus;

means for predicting changes in the levels of said signals on said pair of lines;

means for sensing the levels of the signals on said pair of lines; and means for generating a true stimulus when said signals on said pair of lines are to change and when said signals are to be at equal levels.

4. The circuit of claim 3 further comprising means for generating a complementary stimulus when said signals on said pair of lines are to change and when said two signals are to be at different levels.

5. The circuit of claim 3 wherein said first means comprise a switch coupled between said pair of lines.

6. The circuit of claim 5 wherein said switch is composed of a CMOS transmission gate.

7. The circuit of claim 3 wherein said second means comprises a first inverter and first series switch coupled between said pair of lines, a second inverter and second series switch coupled in back-to-back relationship with said first inverter and first switch and means for operating said first and second switches in synchronism by said complementary stimulus.

8. The circuit of claim 7 wherein said first and second series switches are CMOS transmission gates.

9. The circuit of claim 4 wherein said pair of lines is driven from function generating circuits that provide the digital signals and said means for predicting changes in the levels and means for sensing the levels of said signals are incorporated into said function generating circuits.

* * * * *